United States Patent
Rim et al.

(10) Patent No.: US 11,508,860 B2
(45) Date of Patent: *Nov. 22, 2022

(54) IN-CELL BYPASS DIODE

(71) Applicant: SunPower Corporation, San Jose, CA (US)

(72) Inventors: Seung Bum Rim, Pleasanton, CA (US); Gabriel Harley, Mountain View, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/881,705

(22) Filed: May 22, 2020

(65) Prior Publication Data

US 2020/0357941 A1 Nov. 12, 2020

Related U.S. Application Data

(60) Continuation of application No. 15/220,273, filed on Jul. 26, 2016, now Pat. No. 10,665,739, which is a
(Continued)

(51) Int. Cl.
*H01L 31/0443* (2014.01)
*H01L 31/02* (2006.01)
(Continued)

(52) U.S. Cl.
CPC ...... *H01L 31/0443* (2014.12); *H01L 27/1421* (2013.01); *H01L 31/02008* (2013.01);
(Continued)

(58) Field of Classification Search
CPC . H01L 31/0443; H01L 31/044; H01L 31/024; H01L 31/0465; H01L 31/0463; H01L 31/0475
See application file for complete search history.

(56) References Cited

U.S. PATENT DOCUMENTS

| 4,612,408 A | 9/1986 | Moddel et al. |
| 4,748,130 A | 5/1988 | Wenham et al. |

(Continued)

FOREIGN PATENT DOCUMENTS

| CN | 101165925 | 4/2008 |
| CN | 101647125 | 2/2010 |

(Continued)

OTHER PUBLICATIONS

Office Action from Korean Patent Application No. 10-2016-7036281 dated Oct. 13, 2021, 5 pgs.
(Continued)

*Primary Examiner* — Bethany L Martin
(74) *Attorney, Agent, or Firm* — Schwabe, Williamson & Wyatt, P.C.

(57) ABSTRACT

A solar cell can include a built-in bypass diode. In one embodiment, the solar cell can include an active region disposed in or above a first portion of a substrate and a bypass diode disposed in or above a second portion of the substrate. The first and second portions of the substrate can be physically separated with a groove. A metallization structure can couple the active region to the bypass diode.

11 Claims, 5 Drawing Sheets

Related U.S. Application Data division of application No. 14/472,232, filed on Aug. 28, 2014, now Pat. No. 9,425,337.

(60) Provisional application No. 62/004,808, filed on May 29, 2014.

(51) Int. Cl.
  *H01L 31/0368* (2006.01)
  *H01L 31/18* (2006.01)
  *H01L 27/142* (2014.01)

(52) U.S. Cl.
  CPC .... *H01L 31/03682* (2013.01); *H01L 31/1804* (2013.01); *H01L 31/188* (2013.01); *Y02E 10/50* (2013.01); *Y02E 10/547* (2013.01); *Y02P 70/50* (2015.11)

(56) References Cited

U.S. PATENT DOCUMENTS

| | | | |
|---|---|---|---|
| 6,692,985 | B2 | 2/2004 | Huang et al. |
| 10,665,739 | B2 * | 5/2020 | Rim ................ H01L 31/0443 |
| 2008/0092943 | A1 | 4/2008 | Comfeld et al. |
| 2010/0089435 | A1 | 4/2010 | Lockenhoff |
| 2011/0139216 | A1 | 6/2011 | Lee et al. |
| 2012/0171799 | A1 | 7/2012 | Rim et al. |
| 2012/0318321 | A1 | 12/2012 | Lu et al. |
| 2013/0037078 | A1 | 2/2013 | Chan et al. |
| 2013/0276872 | A1 | 10/2013 | Yin et al. |
| 2015/0136227 | A1 | 5/2015 | Moslehi et al. |
| 2015/0155398 | A1 | 6/2015 | Moslehi et al. |
| 2015/0187969 | A1 | 7/2015 | Moslehi et al. |
| 2015/0194547 | A1 | 7/2015 | Moslehi et al. |
| 2015/0200313 | A1 | 7/2015 | Moslehi et al. |
| 2017/0012153 | A1 | 1/2017 | Rim et al. |

FOREIGN PATENT DOCUMENTS

| | | |
|---|---|---|
| CN | 203339177 | 12/2013 |
| JP | S57138184 A | 8/1982 |
| JP | 2000091616 A | 3/2000 |
| JP | 2013543279 A | 11/2013 |
| WO | WO 2015/183760 | 12/2015 |

OTHER PUBLICATIONS

First Action Interview Pilot Program Pre-Interview Communication from U.S. Appl. No. 14/472,232 dated Jul. 30, 2015, 5 pgs.
International Search Report and Written Opinion from PCT/US2015/032317 dated Aug. 28, 2015, 13 pgs.
First Action Interview Office Action Summary from U.S. Appl. No. 14/472,232 dated Oct. 20, 2015, 6 pgs.
International Preliminary Report on Patentability for PCT Patent Application No. PCT/US15/32317 dated Dec. 8, 2016, 10 pgs.
First Office Action from Chinese Patent Application No. 201580020970.0 dated Mar. 13, 2018, 9 pgs.
First Action Interview Pre-Interview Communication from U.S. Appl. No. 15/220,273 dated Jul. 31, 2018, 10 pgs.
First Action Interview Office Action from U.S. Appl. No. 15/220,273 dated Oct. 16, 2018, 6 pgs.
$2^{nd}$ Office Action for Chinese Application No. 201580020970.0 dated Nov. 16, 2018, 10 pgs.
Final Office Action from U.S. Appl. No. 15/220,273 dated Jan. 30, 2019, 12 pgs.
Non-Final Office Action from Japanese Application No. 2016-558210 dated May 14, 2019, 6 pgs.
Office Action from Taiwan Patent Application No. 104117268 dated Jul. 24, 2019, 16 pgs.
Examination Report No. 1 for Standard Australian Patent Application No. 2015267264 dated Sep. 7, 2019, 3 pgs.
Non-Final Office Action from U.S. Appl. No. 15/220,273 dated Sep. 16, 2019, 11 pgs.
Final Notice of Reasons for Rejection from Japanese Patent Application No. 2016-558210 dated Jan. 10, 2020, 3 pgs.
Substantive Examination Adverse Report from Malaysian Patent Application No. PI2016001740 dated Jan. 28, 2020, 3 pgs.
Notice of Reasons for Refusal from Japanese Patent Application No. 2016-558210 dated Dec. 28, 2020, 5 pgs., with English translation.
Examiner's Report from Australian Patent Application No. 2015267264 dated Aug. 12, 2020, 3 pgs.

* cited by examiner

IN-CELL BYPASS DIODE

CROSS-REFERENCE TO RELATED APPLICATIONS

This application is a continuation of U.S. patent application Ser. No. 15/220,273, filed Jul. 26, 2016, which is a divisional of U.S. patent application Ser. No. 14/472,232, filed Aug. 28, 2014, now U.S. Pat. No. 9,425,337, issued Aug. 23, 2016, which claims the benefit of U.S. Provisional Application No. 62/004,808, filed May 29, 2014, entitled "In-Cell Bypass Diode for Multi-Diode Solar Cell" by Harley et al., the entire contents of which are hereby incorporated by reference.

BACKGROUND

Photovoltaic cells, commonly known as solar cells, are devices for direct conversion of solar radiation into electrical energy. Generally, solar cells are fabricated on a semiconductor wafer or substrate using semiconductor processing techniques to form a P-N junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

DETAILED DESCRIPTION

Figure 1:
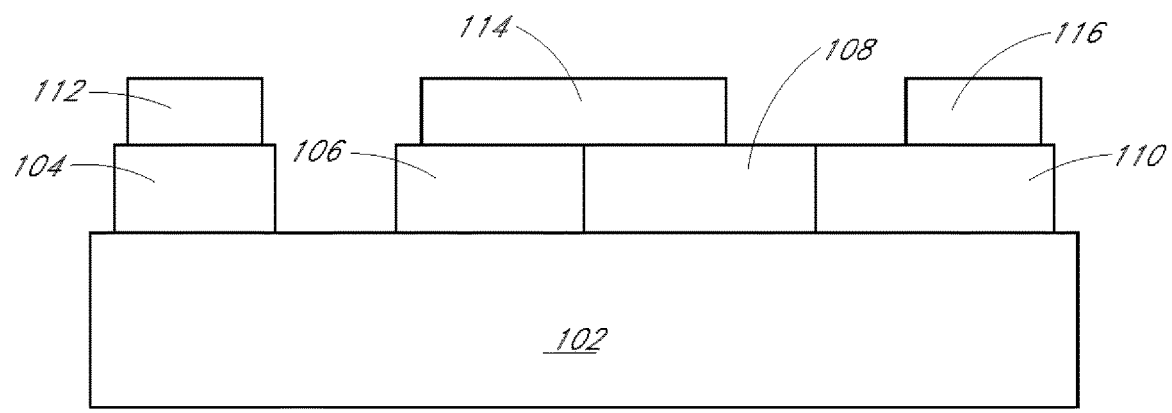
FIG. 1 illustrates a cross-sectional view of a portion of a solar cell before isolation of the substrate to form a bypass diode, according to various embodiments.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology

The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Bypass diodes and approaches to forming bypass diodes, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as solar cell emitter region fabrication techniques, are not described in detail in order to not unnecessarily obscure embodiments of the present disclosure. Furthermore, it is to be understood that the various embodiments shown in the figures are illustrative representations and are not necessarily drawn to scale.

Shading of solar cells is a normal occurrence in the field from built-in shading objects, such as poles or trees, and/or from debris landing or soiling building up on a module. Shading a portion of the solar cell can cause the diode to go in to reverse bias, which can cause it to dissipate power rather than produce it, and can also cause heating of the solar cell. This lowers the performance of the system, can lead to cell breakdown, and may also cause a potential reliability hazard if a hot spot is generated. One solution to this problem is to insert in bypass diodes into the circuit within the junction box of the solar module, so that if a cell or group of cells go in to reverse bias, the bypass diode is activated and the string containing the impaired cells is dropped from the circuit. For a module having 3 (12-18 cell) strings per module, this means a single cell shading event would cause ⅓ of the power to be lost from the panel. In addition, the cost of the diodes is not trivial and needs to be considered in the module balance of materials and overall cost per Watt. String-level protection is not perfect, and some hotspots may not turn on the string-level diodes, and a reliability hazard may still exist. Moreover, in such implementations, hot spot screening is still needed and shading tolerance is poor. Shading can also cause significant loss in residential applications where many rooftops have built-in shading, and also in concentrated PV applications. In various embodiments, an integrated cell-level bypass diode can be implemented to provide a better solution. In some embodiments, metallization can be used as a handle to enable separation of a first portion, which can also be referred to the active cell portion, of a solar cell wafer from a bypass diode portion of the solar cell wafer to enable shunting of opposite polarity to form the bypass diode.

Figure 2:
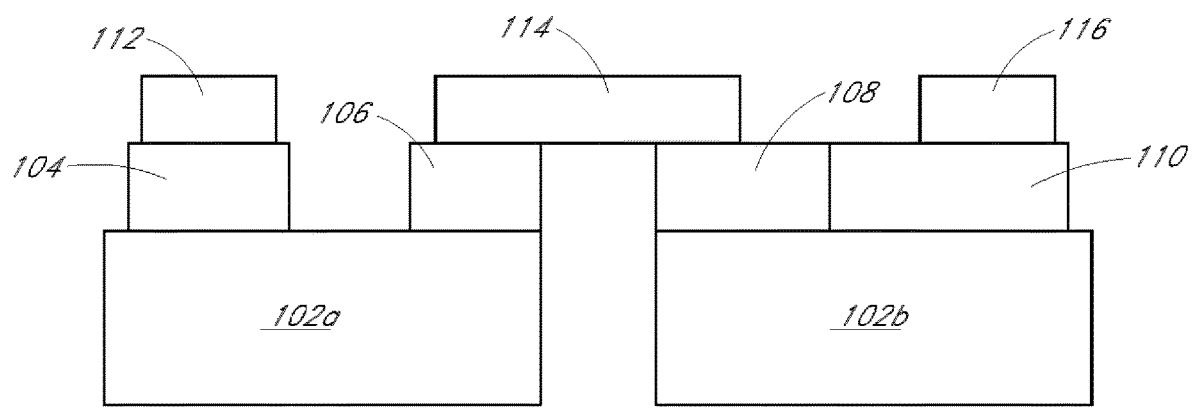
FIG. 2 illustrates a cross-sectional view of a portion of a solar cell after isolation of the substrate to form a bypass diode, according to various embodiments.

Turning now to FIGS. 1 and 2, cross-sectional views of a portion of a solar cell before and after isolation of the substrate to form the bypass diode, respectively, are shown.

Figure 3:
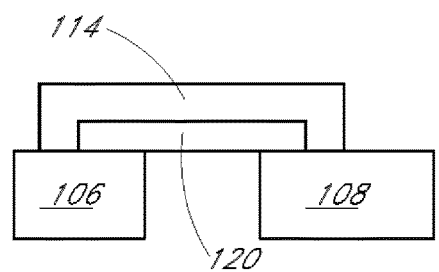
FIG. 3 illustrates a cross-sectional view of a portion of a solar cell having a bypass diode using a buffer for substrate isolation, according to various embodiments.

In various embodiments, the solar cell includes a substrate, such as substrate 102. In one embodiment, the semiconductor substrate can be a bulk monocrystalline silicon substrate portion, such as fabricated from an N-type monocrystalline substrate. In one such embodiment, the doped regions can includes one or more N+ regions (e.g., phosphorous or arsenic doped regions) and one or more P+ regions (e.g., boron doped regions) formed in the substrate itself. In other embodiments, each silicon portion includes one or more polycrystalline silicon (polysilicon) N+ regions and one or more polycrystalline silicon P+ regions formed above a silicon substrate. As shown in FIGS. 1-3, the solar cell includes substrate 102 with P-type doped polysilicon regions 104 and 108 and N-type doped polysilicon regions 106 and 110 disposed above substrate 102. In some embodiments, a dielectric (not shown) can be disposed between substrate 102 and the doped regions 104, 106, 108, and 110.

In one embodiment, the solar cell also includes a metallization structure having contact regions 112, 114, and 116. The contact regions can be metal contacts to route current from the solar cell to an external circuit during normal operation and to shunt the bypass diode to the active portion of the solar cell such that the bypass diode can be configured to activate when the solar cell goes into reverse bias (e.g., due to a shading condition). In various embodiments, solar cell metal (e.g., the metallization structure) can be patterned to form contact regions 112, 114, and 116 to facilitate such current routing and shunting.

In various embodiments, the metallization structure can be plated metal, printed metal, evaporated metal, and/or foil (e.g., a conductive foil, such as an aluminum foil with or without an additional seed layer), among other examples. In one such embodiment, in the case that a relatively thick (e.g., greater that approximately 25 microns) back metal is used, some tolerance for partial laser ablation into the metal may be accommodated and still provide for sufficient mechanical integrity to couple the active portion of the solar cell to the bypass diode. However, if a thin metallization structure is used (e.g., less than approximately 25 microns), ablation may need to be halted without any scribing of the metallization structure, or the metal will need to be reinforced, so as to maintain the electrical and physical integrity of the metal required to survive reliability testing. The metallization structure may be fabricated by plating, printing, by use of a bonding procedure (e.g., in the case of a foil), or may be fabricated by a by a deposition, lithographic, and etch approach.

As shown in FIG. 2, substrate 102 of the solar cell has been isolated to physically separate first portion 102a of the substrate from second portion 102b, which can also be referred to as the bypass diode portion of the substrate. In one embodiment, first portion 102a can be isolated from bypass diode portion 102b using laser ablation, which is described in greater detail below, or by mechanically scribing the substrate. The groove or gap between the physically separated semiconductor substrate portions can expose a portion of the metallization structure and/or a portion of the doped regions.

As illustrated, contact region 114 of the metallization structure can electrically and mechanically couple the active portion of the solar cell to the bypass diode. For example, metal of contact region 114 can electrically couple N-type doped region 106 disposed above first portion 102a to P-type doped region 108 disposed above second portion 102b. As used herein, the portion of the solar cell that includes first portion 102a, and its corresponding doped regions (e.g., doped regions 104 and 106) is referred to as the active region of the solar cell. As used herein, the portion of the solar cell that includes second portion 102b and its corresponding doped regions (e.g., doped regions 108 and 110) is referred to as the bypass diode of the solar cell. Note that the overall metallization structure can also electrically and mechanically couple respective N-doped regions of the active portion to one another as well as respective P-doped regions of the active portion to one another.

As described herein, the bypass diode can include a P-N junction disposed in or above the substrate. The P-N junction can be formed with amorphous silicon, polysilicon, metal, and/or silicon. For example, as shown in FIGS. 1-3, the P-N junction of the bypass diode can be a P-type polysilicon/N-type polysilicon butting junction (without a trench separating the doped regions) or a vertical P+/N+ polysilicon junction. As other examples, the P-N junction of the bypass diode can be formed from P+ and N+ doped regions in the silicon substrate itself, from a metal/silicon junction (e.g., Shottky), from a polysilicon/silicon junction, or from an amorphous silicon/silicon junction.

As shown, the P-N junction of the bypass diode can be coupled, via the metallization structure (e.g., contact region 114) to a doped region disposed in or above (above in the example of FIGS. 1-3) the portion of the substrate corresponding to the active region.

In some embodiments, scribing of the substrate can also scribe at least a portion of one or more doped regions (e.g., N-type doped region 106 and P-type doped region 108) as shown, although it is not necessary in other embodiments. In some embodiments, a portion of contact region 114 can also be scribed.

In some embodiments, to inhibit damage of the metal during a substrate or wafer (e.g., silicon) isolation process, a buffer material can be used as a back-stop for the isolation process, for example, to protect the metallization structure from being directly scribed. FIG. 3 illustrates a cross-sectional view of a portion of a solar cell using a buffer material as a back-stop for bypass diode isolation. In one embodiment, buffer material 120 can be formed on doped regions 106 and 108 before the metallization structure is formed. Accordingly, when isolation of the substrate occurs, the laser or mechanical scribe hits buffer material 120 rather than scribing away some of the metallization structure (e.g., contact region 114). By keeping the metallization structure intact, mechanical and electrical integrity can be preserved.

Example buffer materials include polymeric or other metal or non-metal materials, such as polyimide. The polymer may be globally deposited and then patterned or may be deposited only in desired regions, e.g., by printing. In other embodiments, such a buffer material can include a dielectric material such as, but not limited to, silicon dioxide ($SiO_2$), silicon nitride (SiN) or silicon oxynitride (SiON). In one such embodiment, the dielectric material can be formed using a deposition technique such as, but not limited to, low pressure chemical vapor deposition (LPCVD), plasma enhanced chemical vapor deposition (PECVD), high density plasma chemical vapor deposition (HDPCVD) or physical vapor deposition (PVD).

In some embodiments, the resulting groove or gap between substrate portions 102a and 102b can be filled with an encapsulant material or other material, e.g., ethylene vinyl alcohol (EVA), poly-olefin, disposed in the groove between portions 102a and 102b of the substrate. In one embodiment, as applied, the encapsulant can have sufficiently low viscosity or high melt-flow to ensure that the encapsulant material flows into the thin groove. In one embodiment, the filling of the groove by the encapsulant acts to improve the mechanical strength of the system through formation of Si/metal/polymer composite. In some embodiments, the groove can be passivated, or left as is after the isolation is performed.

In an embodiment, the metallization scheme described herein is used to hold and provide mechanical integrity for the cell and its respective bypass diode and permit physical separation of the substrate between the bypass diode and active portion of the cell. And isolating the substrate can enable the bypass diode to function in a reverse bias condition.

Figure 4:
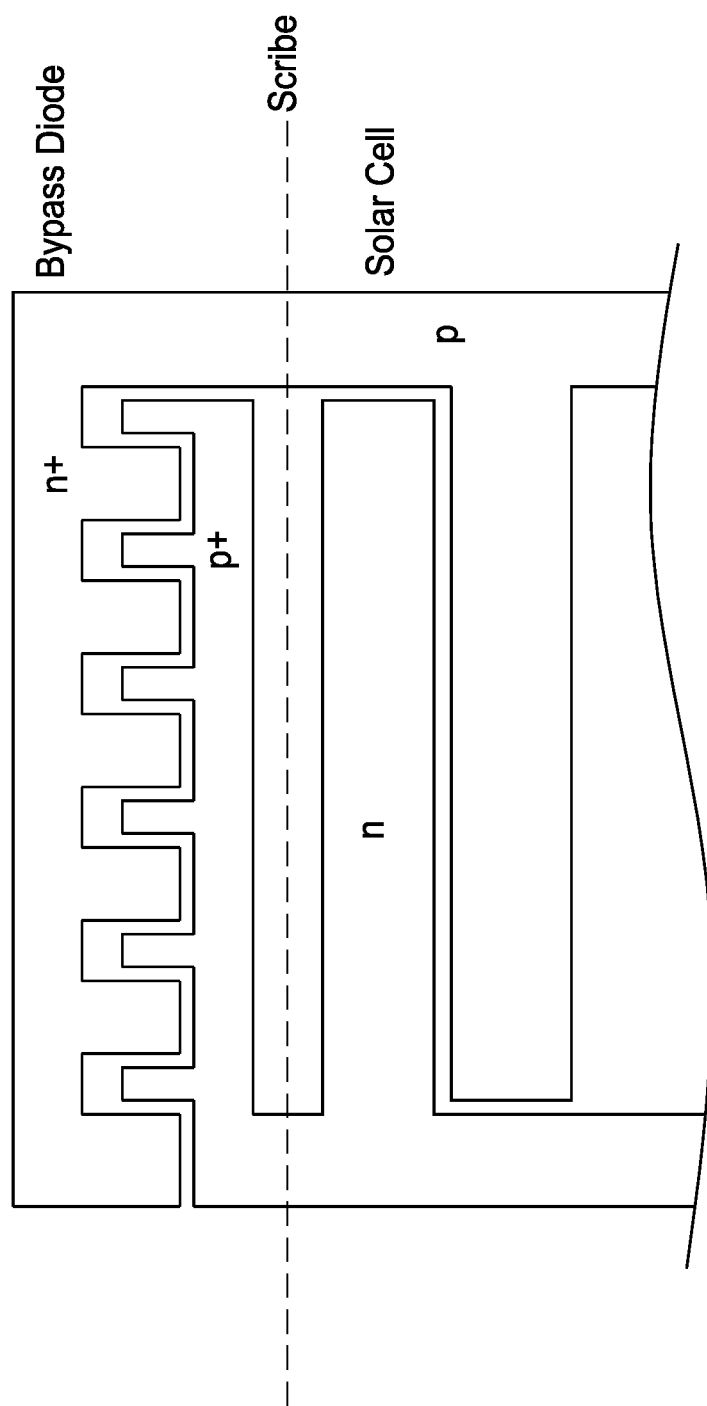
FIG. 4 illustrates a top-down plan view of a bypass diode for a solar cell, according to various embodiments.

Turning now to FIG. 4, a top-down plan view, from the metallization structure side, of an example bypass diode in a solar cell is shown, according to one embodiment. As shown, above the scribe line (shown as a dashed line because it is from the side opposite of the metallization structure) is the bypass diode P-N junction and below the scribe line is a p-n junction of the active region of the solar cell. P is coupled to N and N is coupled to P to shunt the bypass diode to the P-N junction (diode) of the solar cell. Because the substrate of the bypass diode is isolated from the active portion of the solar cell as indicated by the dashed line, the illustrated configuration can operate as an in-cell bypass diode.

Figure 5:
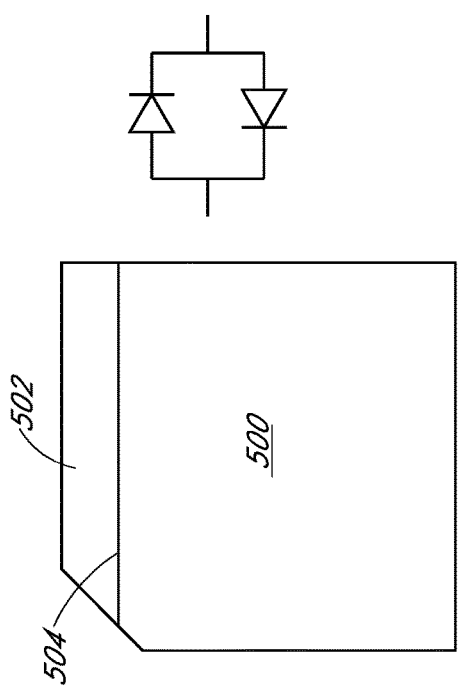
FIGS. 5-7 illustrate various examples of bypass diode arrangements and sizes, according to various embodiments.
Figure 6:
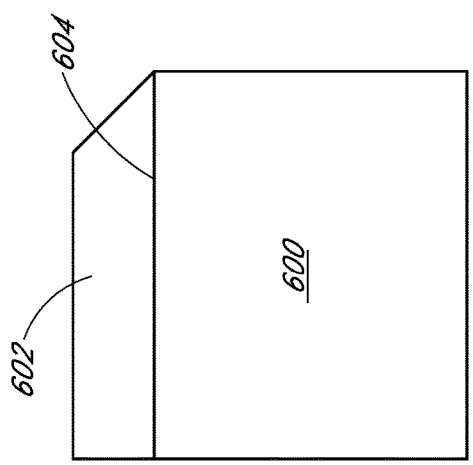
Figure 7:
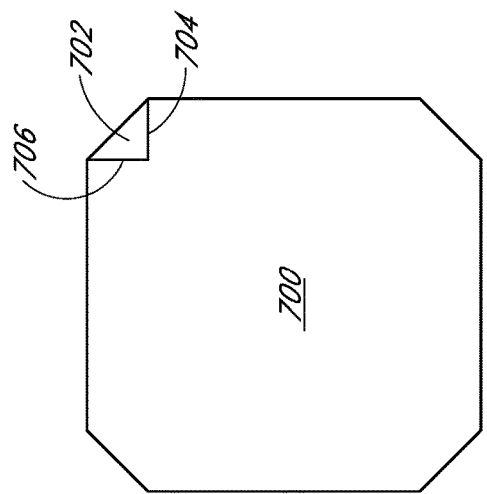

FIGS. 5-7 illustrate various examples of bypass diode arrangements and sizes, according to various embodiments. In FIG. 5, bypass diode 502 is shown separated from active portion 500 of the solar cell by scribe line 504 (which corresponds to the location at which the substrate portions are isolated). Similarly in FIG. 6, bypass diode 602 is shown separated from active portion 600 of the solar cell by scribe line 604. In some embodiments, the bypass diode can be formed in the corner of a solar cell, for example, in the pseudo corners shown in FIGS. 5 and 6 in which the corner is not a right angle because current can be more difficult to collect from those locations. Because the bypass diode region does not generate current during normal operation of the solar cell, choosing a bypass diode location from which current is difficult to collect anyway can be advantageous.

Moreover, for concentrated PV applications, the bypass diode can be formed at the edge of the solar cell where less direct light is incident during operation of the solar cell. By forming the bypass diode at the edge, the more productive area (e.g., the center) of the solar cell is used for the active region and the less productive area can be sacrificed for use as the bypass diode.

FIG. 7 illustrates another example bypass diode configuration. As shown, bypass diode 702 is separated from active portion 700 of the solar cell by multiple scribe lines, scribe lines 704 and 706, which form first and second grooves to separate the active portion of the substrate from the bypass diode portion of the substrate.

In various embodiments, the size of the bypass diode can depend on a number of factors, such as application (e.g., concentrated or one-sun PV), size of the solar cell, efficiency of the cell, expected heat dissipation (e.g., whether or not a heat sink or other thermal dissipation is implemented to dissipate heat from the bypass diode region), among other examples. In one embodiment, the example solar cell of FIG. 7 is a one-sun application in which less thermal impact of the bypass diode can be expected. Accordingly, a smaller footprint can be used for the bypass diode, with it just residing in one of the corners (pseudo corner in this example) of the solar cell whereas the other corners are available as part of the active portion.

The examples of FIGS. 5 and 6 can offer some advantages in manufacturing efficiency. For example, consider the scenario in which the solar cells of FIGS. 5 and 6 were originally part of the same larger solar cell before being diced into quarter cells. In such a scenario, bypass diodes 502 and 602 could have originally been formed as a single bypass diode with a single scribe line with scribes 504 and 604 being part of a single scribe before the larger solar cell was diced. Furthering that example, before dicing the larger cell, another single scribe of the substrate can be made to isolate another portion of the substrate and form another larger bypass diode on the opposite side of the larger solar cell. The larger solar cell could then be diced into quarter cells with each quarter cell having its own respective bypass diode with the respective quarter cells and corresponding bypass diodes being isolated in the substrate, as described herein.

Not illustrated in FIGS. 5-7, the solar cell metal can be patterned to shunt the bypass diode and active area diode such that the bypass diode can be configured to turn on when the solar cell goes into reverse bias (e.g., in a shading condition).

In various embodiments, strings of the disclosed solar cells with in-cell bypass diodes can be used together in a PV module or PV laminate.

Figure 8:
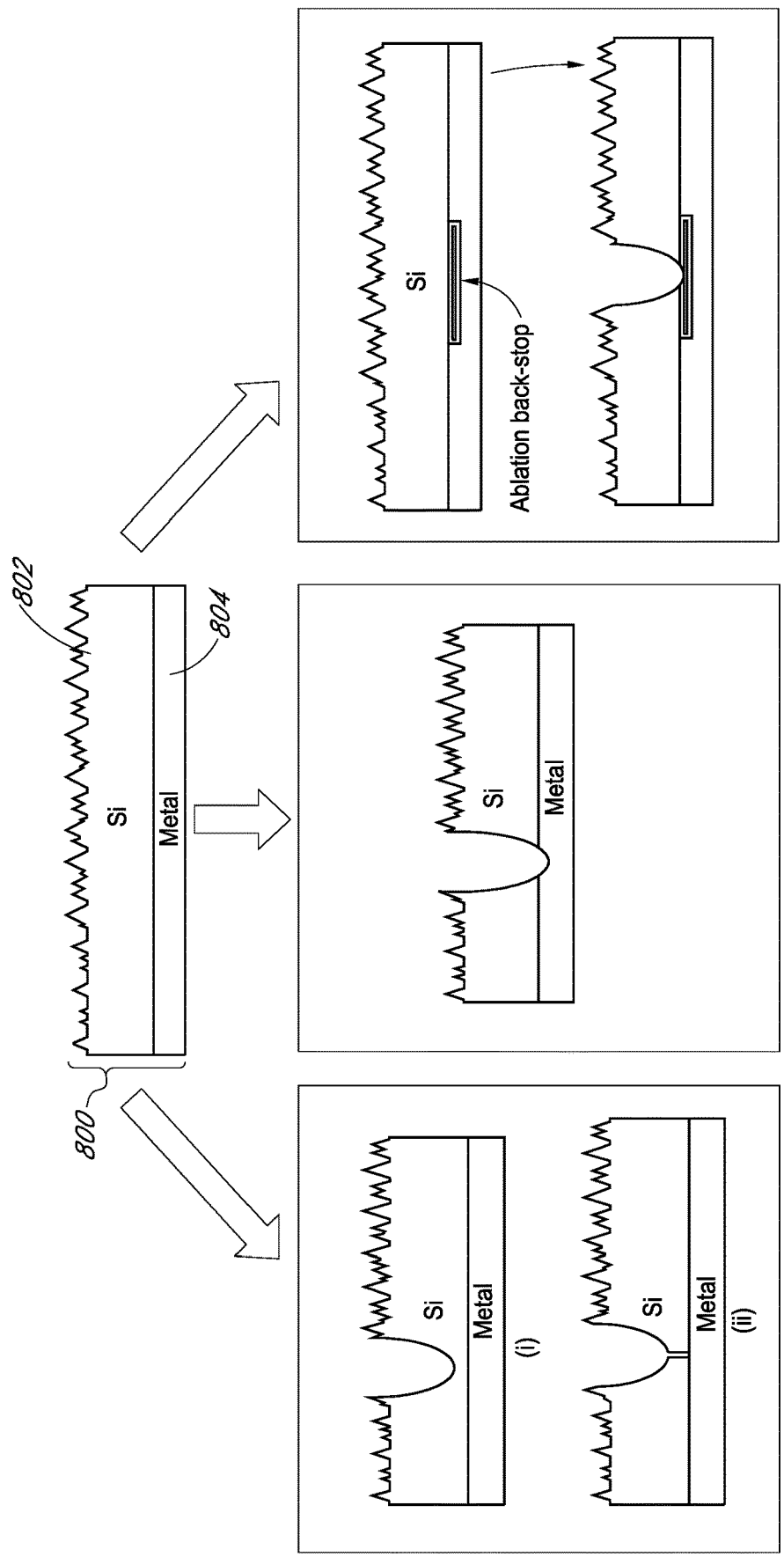
FIGS. 8a-c illustrate various example pathways for isolating the solar cell substrate, according to various embodiments.

As a representative example of isolating the solar cell substrate to form a bypass diode, FIGS. 8A-8C illustrate various example pathways for isolating the substrate. Referring to FIGS. 8A-8C, solar cell 800 includes a silicon substrate 802 and a metallization structure 804 on a back side of the silicon substrate. Doped regions are not illustrated for ease of understanding.

Referring to FIG. 8A, a scribe plus break approach is depicted where (i) the substrate is partially scribed (e.g., approximately 70% depth) and then (ii) cracked along the break to terminate at the metallization structure. Referring to FIG. 8B, a scribe-only approach is depicted where the laser ablation of the silicon stops on (or partially into) a metal of the metallization structure. Referring to FIG. 8C, a scribe plus buffer material approach is depicted where the laser ablation of the silicon is performed through the entire depth of the silicon and then stops on (or partially into) a buffer material distinct from the metal of the metallization structure. In any of these cases, laser parameters can be configured to achieve the disclosed scribed. For example, an option includes pico-second laser ablation having a cleaner process, lower recombination, lower risk of shunting through melted doped regions, and narrower scribe width. Another option includes a nano-second or longer laser having wider scribe lines and higher throughput but increased recombination and potential for debris.

Figure 9:
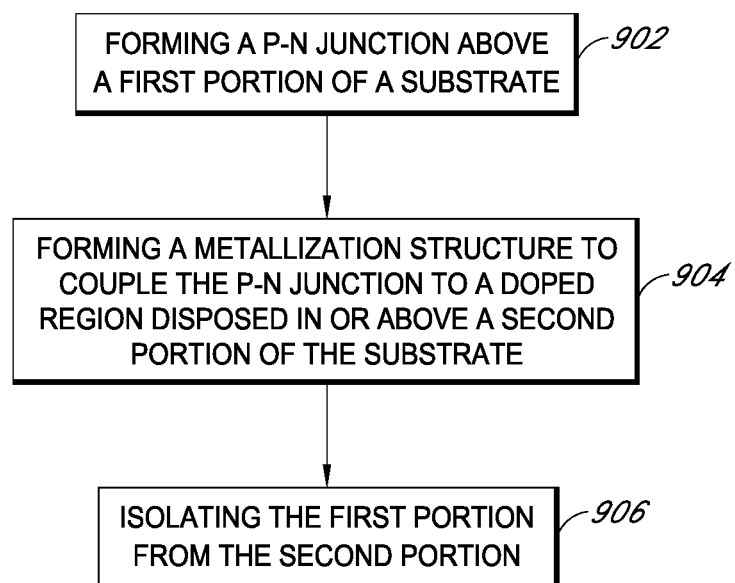
FIG. 9 is a flowchart illustrating an example method for forming a bypass diode, according to various embodiments.

Turning now to FIG. 9, a flow chart illustrating a method for forming a bypass diode is shown, according to some embodiments. In various embodiments, the method of FIG. 9 may include additional (or fewer) blocks than illustrated.

As shown at 902, a P-N junction can be formed above a first portion of a semiconductor substrate. As described herein, the P-N junction can be formed with a variety of materials, such as amorphous silicon, polysilicon, metal, and/or silicon. For example, the bypass diode can be formed with P-type polysilicon and N-type polysilicon (e.g., by forming a butting junction without a trench as shown in FIGS. 1-3). As other examples, the junction can include P-type silicon and N-type silicon, or metal and silicon (e.g., Shottky diode), or polysilicon and silicon, or amorphous silicon and silicon, among other examples.

In some embodiments, forming the bypass diode P-N junction can occur in a same process (e.g., doping, etc.) that is used to form the P-N junctions (and respective N-type doped regions and P-type doped regions) of the active portion.

At 904, a metallization structure can be formed above a first surface of the substrate to couple the P-N junction to a doped region disposed in or above a second portion of the substrate. In an embodiment, forming the metallization structure over a first surface of the semiconductor substrate can including forming the metallization structure over doped regions disposed above or in the semiconductor substrate. Forming the metallization structure can also include patterning the metallization structure into a finger pattern (e.g., an interdigitated finger patter) as well as to shunt the bypass diode to the solar cell. As described herein, the metallization structure can be a metal foil, printed metal, plated metal, a stack of metals, or some combination thereof. Patterning of the metal can be performed by laser patterning, mask and etching, among other patterning examples. In any case, in an embodiment the metallization structure is formed to have mechanical properties sufficient to bridge the active portion of the solar cell to the bypass diode portion.

As illustrated at 906, the first portion of the substrate can be isolated from the second portion. In one embodiment, the semiconductor substrate can be scribed from the opposite surface of the metallization structure. The scribing can be stopped upon exposing portions of the metallization structure from that opposite surface.

In one embodiment, the scribing can be stopped by metal of the metallization structure. In other embodiments, however, a damage buffer material can be used to protect the metal of the metallization structure. In one such embodiment, the damage buffer can be a polymer material, as described above. In another embodiment, the damage buffer can be a metal distinct from the metal of the metallization structure.

In one embodiment, scribing can be performed with a laser. However, it is to be appreciated that a mechanical scribing process may be implemented instead of or in conjunction with a laser scribing process. For example, in a particular embodiment, a partial laser scribe is performed, followed by breaking or sawing with depth control.

In one embodiment, scribing can be performed in multiple directions. For example, as shown the example of FIG. 7, multiple scribe lines can be formed by scribing in multiple directions. In one such example, the multiple directions can be approximately perpendicular to one another.

In various embodiments, for example for efficiency in manufacturing, a larger solar cell can be diced into smaller cells (e.g., as described regarding FIGS. 5 and 6). In some of those embodiments, a single scribing of the substrate for the larger solar cell can result in multiple bypass diodes when the larger solar cell is diced. Taking the solar cell examples of FIGS. 5 and 6, consider the scenario in which the right hand side of the solar cell of FIG. 5 was connected to the left hand side of the solar cell of FIG. 6 before the cells were diced. Further, consider two other such diced solar cells being part of the original larger solar cell such the solar cells of FIGS. 5 and 6 with the two others each being quarter cells of the larger cell. In one embodiment, the scribing of the substrate for the bypass diode can be performed with two scribe lines. As one simple example, when view from the top-down perspective, the top and bottom edges of the silicon substrate can be isolated from the center portion (e.g., by the scribing techniques described herein), and corresponding P-N junctions can be formed over the top and bottom (before the scribing) portions corresponding to the bypass diodes as well as in the center portion.

In various embodiments, additional scribing can be performed to actually dice the solar cells apart. Such additional scribing (e.g., laser or mechanical) can be substantially the same as described herein, except that where dicing of the solar cells is intended, isolation occurs not just at the substrate but also through the metallization structure to cause full separation.

In some embodiments, the light-receiving surface of the semiconductor substrate can be texturized, before or after scribing the semiconductor substrate. In one such embodiment, a partial grooving of the substrate is first performed, and then any damage is removed during a silicon etch process (e.g., texturing). However, in other embodiments, the scribing may be performed and then a subsequent wet etch is implemented. In any case, texturizing of the light-receiving surface of the solar cell can, in one embodiment, involve texturizing using a hydroxide-based etch process. It is to be appreciated that a texturized surface may be one which has a regular or an irregular shaped surface for scattering incoming light, decreasing the amount of light reflected off of the light-receiving surface of the solar cell. Additional embodiments can include formation of a passivation or anti-reflective coating layer on the light-receiving surface.

Overall, although certain materials are described specifically above, some materials may be readily substituted with others with other such embodiments remaining within the spirit and scope of embodiments of the present disclosure. For example, in an embodiment, a different material substrate, such as a group material substrate, can be used instead of a silicon substrate. In another embodiment, a polycrystalline or multi-crystalline silicon substrate is used. Furthermore, it is to be understood that, where N+ and P+ type regions are described specifically, other embodiments contemplated include a switched conductivity type, e.g., P+ and N+ type regions, respectively.

One or more benefits or advantages of embodiments described herein can include simplifying the manufacturing process by incorporating bypass diode formation as part of the cell manufacturing process, which can remove the additional bypass diode assembly step at the module level. Additionally, the disclosed techniques can provide protection at the individual cell level which can protect cells more reliably than in scenarios where a single bypass diode is shared amongst multiple cells. Moreover, for an application in which a larger solar cell is diced, scribing of the substrate to form the bypass diode can be part of the dicing process and not add much, if any, additional cost to the process.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The invention claimed is:

1. A solar cell, the solar cell comprising:
a semiconductor substrate having a first conductivity;
a first P-N junction disposed in or above a first portion of the semiconductor substrate;
a second P-N junction disposed in or above a second portion of the semiconductor substrate, wherein the first portion of the semiconductor substrate is physically isolated from the second portion by a scribe disposed entirely through the semiconductor substrate and opposite the first P-N junction and the second P-N junction; and
a metallization structure disposed on a portion of the first P-N junction and on a portion of the second P-N junction disposed so as to couple the first P-N junction to the second P-N junction above the semiconductor substrate, wherein the first portion of the semiconductor substrate is physically isolated from the second portion so as to provide an in-cell bypass diode from the second portion.

2. The solar cell of claim 1, wherein the scribe is disposed along a first direction and along a second direction different from the first direction.

3. The solar cell of claim 1, wherein the first P-N junction above the first portion includes abutting P-type and N-type polysilicon regions.

4. The solar cell of claim 1, wherein the substrate is an N-type doped substrate.

5. The solar cell of claim 1, wherein the first P-N junction is disposed in the first portion of the semiconductor substrate, and wherein the second P-N junction is disposed in the second portion of the semiconductor substrate.

6. The solar cell of claim 1, wherein the first P-N junction is disposed above the first portion of the semiconductor substrate, and wherein the second P-N junction is disposed above the second portion of the semiconductor substrate.

7. The solar cell of claim 1, wherein the solar cell comprises two sub-cells each having a respective in-cell bypass diode that comprises a portion of the first P-N junction.

8. The solar cell of claim 1, wherein the in-cell bypass diode is located at an edge of the solar cell.

9. The solar cell of claim 1, further comprising a buffer material disposed between the metallization structure and the portion of the first P-N junction and the portion of the second P-N junction.

10. The solar cell of claim 1, wherein the metallization structure comprises a conductive foil.

11. The solar cell of claim 10, wherein the conductive foil comprises aluminum foil.

* * * * *